United States Patent
Boulay et al.

[11] Patent Number: 5,978,212
[45] Date of Patent: Nov. 2, 1999

[54] DISK DRIVE LOCKING MEMBER WITH HANDLE

[75] Inventors: Steven G. Boulay, Shrewsbury; Stanley W. Stefanick, Uxbridge; Jeffrey E. Gravel, Auburn, all of Mass.

[73] Assignee: Digital Equipment Corporation, Houston, Tex.

[21] Appl. No.: 08/808,596

[22] Filed: Feb. 28, 1997

[51] Int. Cl.$^6$ ................................ G06F 1/16; H05K 5/02
[52] U.S. Cl. ........................... 361/685; 361/726; 292/19; 312/332.1
[58] Field of Search ................................. 292/19, 87, 91; 312/332.1, 333, 348.6; 364/708.1; 361/684, 685, 726, 740, 747; 16/110 R; 439/353, 347, 377, 928.1

[56] References Cited

U.S. PATENT DOCUMENTS

| | | | |
|---|---|---|---|
| 3,567,303 | 3/1971 | Fox et al. | 312/332.1 |
| 4,002,386 | 1/1977 | McKenzie | 312/332.1 |
| 4,977,532 | 12/1990 | Borkowicz et al. | 364/708 |
| 5,123,721 | 6/1992 | Seo | 312/332 |
| 5,155,662 | 10/1992 | I-Shou | 361/392 |
| 5,233,594 | 8/1993 | Wilhelm | 369/75.1 |
| 5,247,427 | 9/1993 | Driscoll et al. | 361/685 |
| 5,262,923 | 11/1993 | Batta et al. | 361/685 |
| 5,269,698 | 12/1993 | Singer | 439/157 |
| 5,327,323 | 7/1994 | Yeom et al. | 361/685 |
| 5,332,306 | 7/1994 | Babb et al. | 312/334.16 |

FOREIGN PATENT DOCUMENTS 3-224021  10/1991  Japan .

OTHER PUBLICATIONS

StorageWorks Solutions, Information Sheet Fibre Channel Arbitrated Loop 8–SBB Shelf, Aug. 1996.
Boulay, Steven G., Information Disclosure Statement, Compaq "Proliant 1500".

*Primary Examiner*—Lynn D. Feild
*Attorney, Agent, or Firm*—Hamilton, Brook, Smith & Reynolds, P.C.

[57] ABSTRACT

A locking member formed of resilient material for locking a disk drive within a computer enclosure includes a first cantilevered beam portion positioned along a first side of the disk drive. A first locking protrusion is positioned on the first cantilevered beam portion and is capable of engaging with the enclosure for locking the disk drive therein. A handle portion extends from the cantilevered beam portion for resiliently bending the first cantilevered beam portion inwardly to disengage the first locking protrusion from the enclosure.

23 Claims, 5 Drawing Sheets

DISK DRIVE LOCKING MEMBER WITH HANDLE

BACKGROUND

Some computers are designed to accommodate a series of removable disk drives where each disk drive is housed within its own housing which can slide in and out of the computer enclosure along a set of guides. An electrical connector at the rear of each disk drive is capable of releasably engaging with a corresponding electrical connector within the computer enclosure for electrically connecting each disk drive to the computer. The disk drive housings are releasably locked in place within the computer enclosure by a pair of locking mechanisms located on opposite sides of each disk drive housing. These locking devices typically consist of pivoting levers having cam surfaces or spring-loaded locking protrusions.

SUMMARY OF THE INVENTION

A drawback of current removable disk drives is that the disk drive housing is rather large. In addition, the number of parts making up the disk drive housing makes the disk drive housing relatively expensive. The present invention provides a housing and locking arrangement for a removable disk drive which not only is more compact than current approaches but is also less expensive due to the small number of parts required.

The present invention is directed to a locking member formed of resilient material coupled to a disk drive for locking the disk drive within a computer enclosure. A first cantilevered beam portion is positioned along a first side of the disk drive and a first locking protrusion is positioned on the first cantilevered beam portion. The locking protrusion is capable of engaging with the enclosure for locking the disk drive therein. A handle portion extends from the first cantilevered beam portion for resiliently bending the first cantilevered beam portion inwardly to disengage the first locking protrusion from the enclosure.

In preferred embodiments, the locking member is formed from one piece of plastic. A second cantilevered beam portion is positioned along a second side of the disk drive. A second locking protrusion is positioned on the second cantilevered beam portion and is capable of engaging with the enclosure for further locking the disk drive therein. The handle portion extends between and is at a right angle to the first and second cantilevered beam portions. The handle portion is also capable of resiliently bending the second cantilevered beam portion inwardly to disengage the second locking protrusion from the enclosure. A first guide portion is positioned along the first side of the disk drive with the first cantilevered beam portion extending from the first guide portion. A second guide portion is positioned along the second side of the disk drive with the second cantilevered beam portion extending from the second guide portion. The first and second guide portions guide the disk drive within the enclosure.

The disk drive and locking member are preferably mounted to a shallow tray, thereby forming a disk drive assembly. The small number of parts making up the disk drive assembly as well as the low profile of the tray results in an inexpensive and compact disk drive assembly which in turn enables computers to be built that are less expensive and more compact than obtainable with current removable disk drives.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
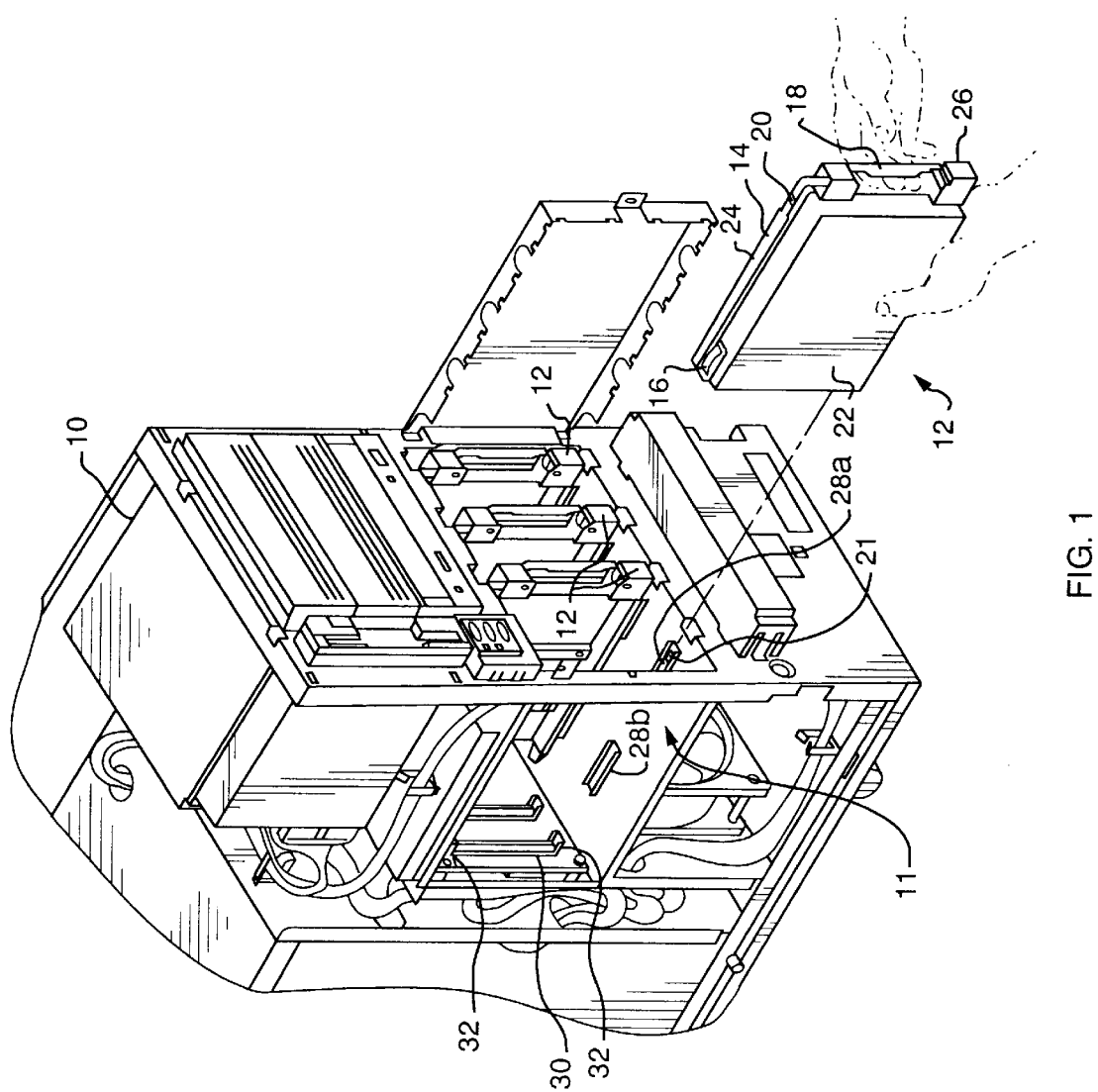
FIG. 1 is a perspective view of a portion of a computer enclosure depicting the insertion of a disk drive assembly within the computer enclosure in which the disk drive assembly is constructed in accordance with the present invention.
Figure 2:
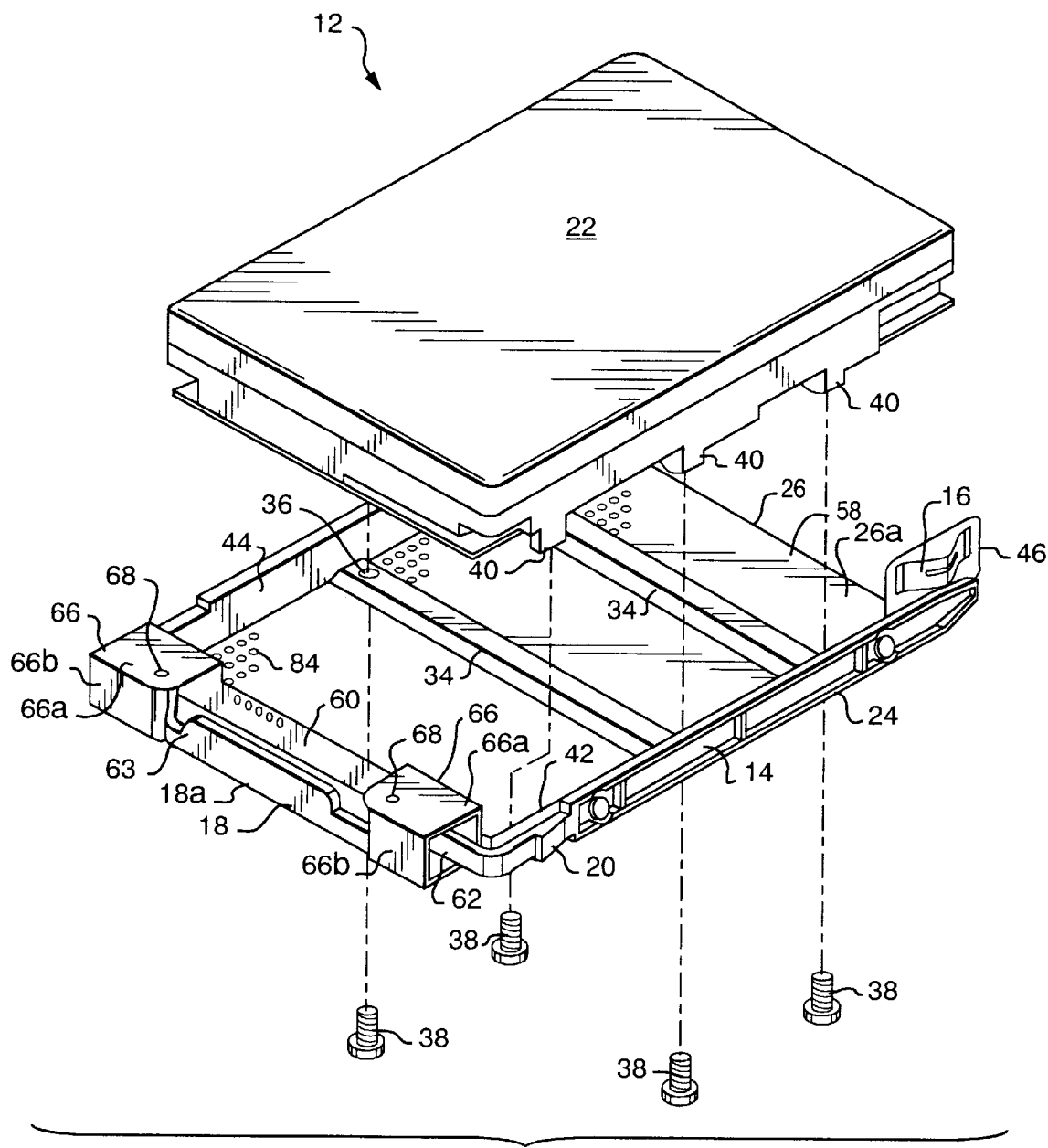
FIG. 2 is an exploded perspective view of the disk drive assembly.
Figure 3:
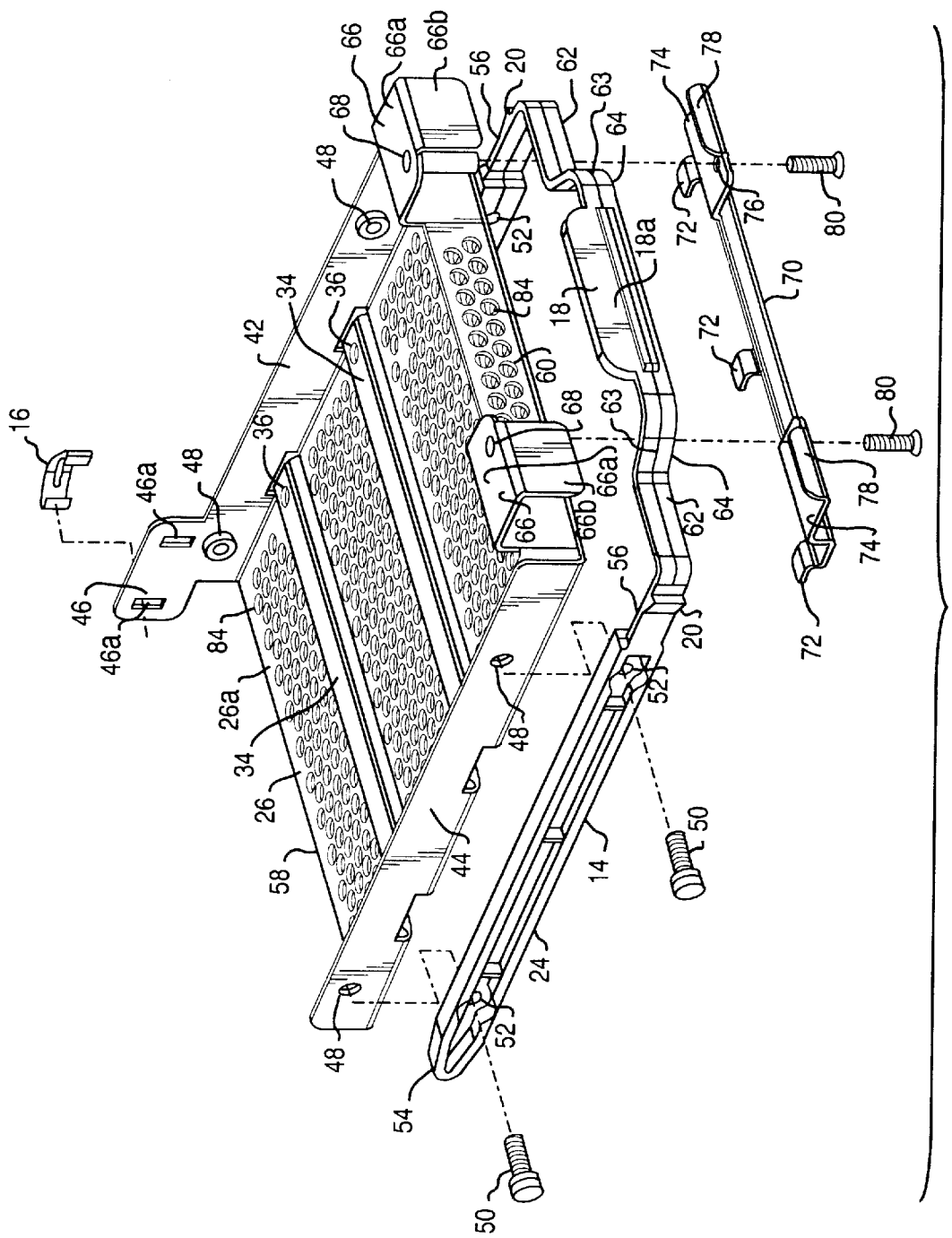
FIG. 3 is an exploded perspective view of the carrier tray assembly.
Figure 4:
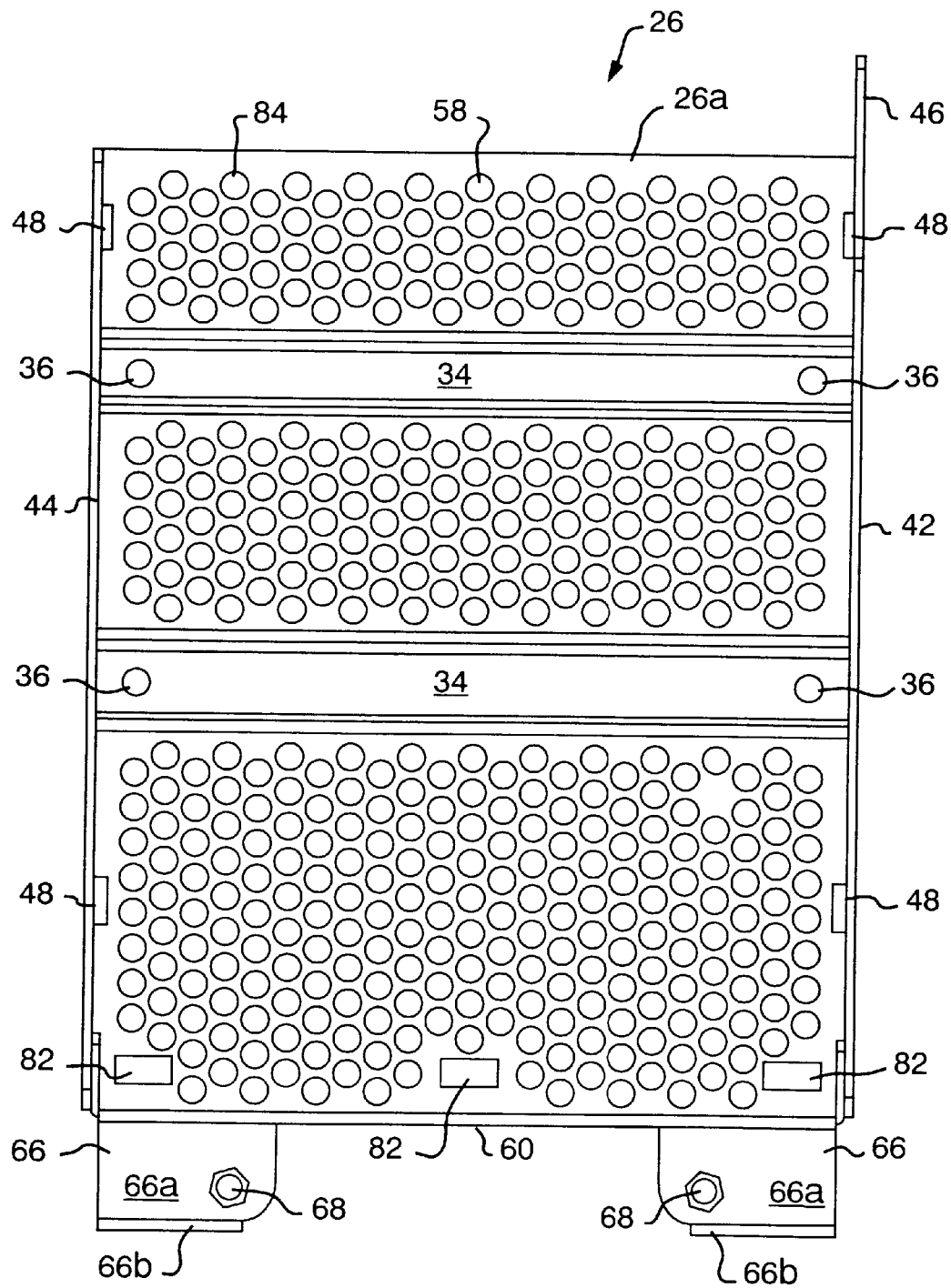
FIG. 4 is a top view of the carrier tray.
Figure 5:
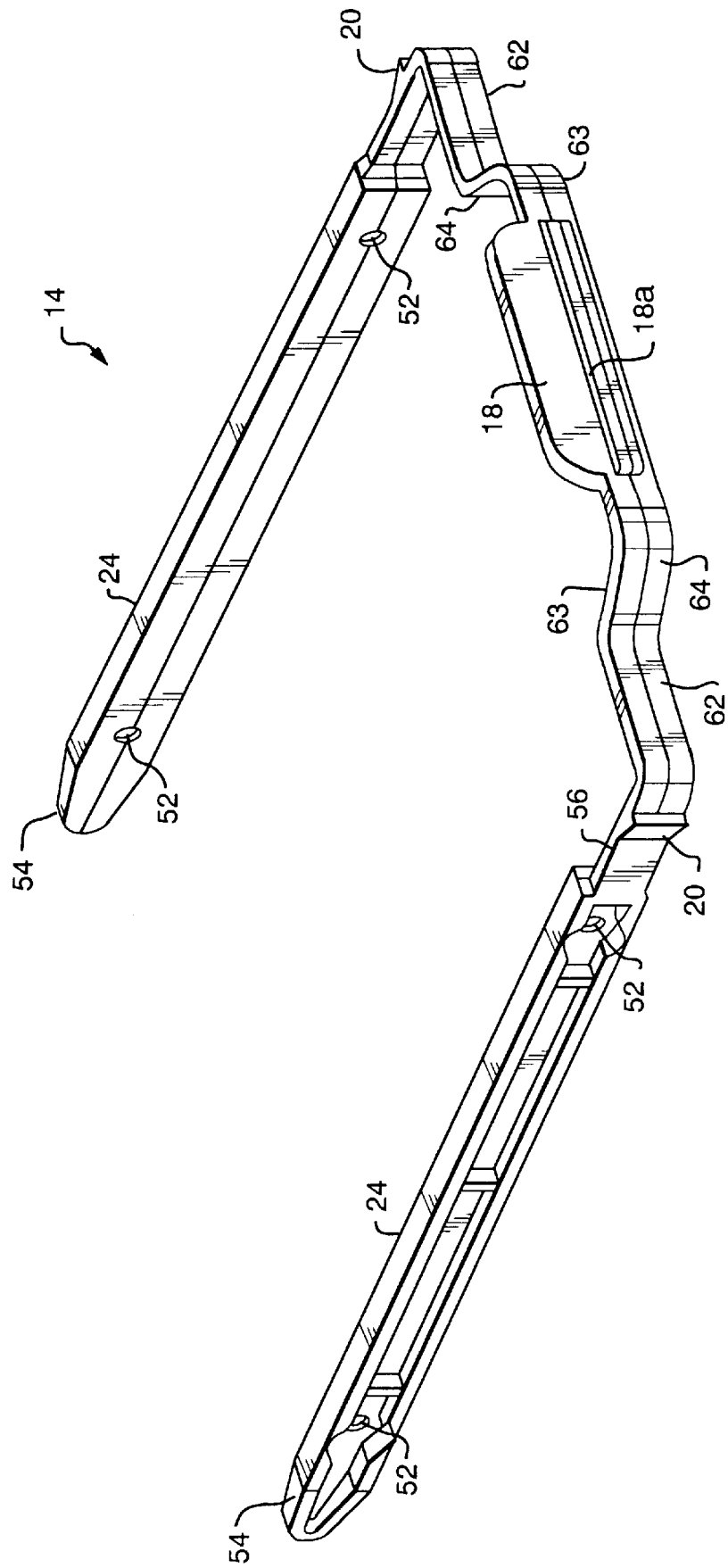
FIG. 5 is a perspective view of the locking member.

Referring to FIG. 1, a computer enclosure 10 housing a computer includes a bay 11 for housing a series of removable disk drive assemblies 12 therein. Each disk drive assembly 12 has a quick release locking feature allowing the disk drive assembly 12 to be both quickly inserted and removed from bay 11. Each disk drive assembly 12 includes a disk drive 22 mounted upon a low profile metallic carrier tray 26. A resilient locking member 14 having a pair of guide portions 24, a pair of locking protrusions 20 and a handle portion 18 are mounted to the outer sides of the carrier tray 26.

In order to install a disk drive assembly 12 within bay 11, the guide portions 24 of locking member 14 are inserted into guide rails 28a/28b located above and below on opposite sides of bay 11. The disk drive assembly 12 is then slid into bay 11 along guide rails 28a/28b. An electrical connector (not shown) at the rear of disk drive 22 is guided into a corresponding electrical connector 30 located at the rear of bay 11 by connector guides 32. Electrical connector 30 electrically connects the disk drive 22 to the computer. The locking protrusions 20 have an angled rear surface so that locking protrusions 20 are able to pass over the surface of the first set of guide rails 28a and are pushed inwardly towards each other by guide rails 28a. When locking protrusions 20 on locking member 14 reach recesses 21 in the first set of guide rails 28a, locking protrusions 20 move outwardly and engage recesses 21 for locking disk drive assembly 12 within bay 11. A resilient metallic spring member 16 on the side of carrier tray 26 engages a ground connector (not shown) within bay 11 for electrically grounding carrier tray 26. Carrier tray 26 protects disk drive 22 from electrostatic discharge during installation by shielding sensitive electronic components and spring member 16 directs electrostatic discharge energy to computer enclosure 10 when installed.

In order to remove disk drive assembly 12 from bay 11, handle portion 18 is pulled in the direction away from disk drive 22. This moves locking protrusions 20 inwardly toward each other which disengages the protrusions 20 from recesses 21. Disk drive assembly 12 can then be pulled out of bay 11 while sliding along guide rails 28a/28b. A single motion, pushing or pulling, is all that is required to install or remove disk drive assembly 12 within or from bay 11. In addition, disk drive assembly 12 is suitable for both right-handed and left-handed installation/removal.

Referring to FIGS. 2, 3, 4 and 5, carrier tray 26 is fabricated from sheet metal and includes a tray portion 26a, two side walls 42/44, and a front wall 60. The side walls 42/44 and front wall 60 are bent upwardly from tray portion 26a and do not extend above the height of disk drive 22. The rear portion 58 of carrier tray 26 is open to allow the rear of disk drive 22 to extend from carrier tray 26 for interfacing with connector 30 within bay 11. Tray portion 26a includes two ribs 34 with mounting holes 36. Ribs 34 are raised above and extend across tray portion 26a providing rigidity to tray portion 26a. Disk drive 22 has feet 40 for mounting disk drive 22 to ribs 34 with screws 38 through mounting holes 36. Tray portion 26a and front wall 60 include a pattern of holes 84 therethrough which promote air flow for cooling the disk drive 22. In addition, ribs 34 raise disk drive 22 above tray portion 26a forming a gap therebetween to promote further air circulation. Spring member 16 is mounted to an ear 46 extending upwardly from side wall 42. Spring member 16 has two fingers which engage slots 46a (FIG. 3) of ear 46 securing spring member 16 thereto. Two flanges 66 extend from front wall 60 and have a first portion 66a and a second portion 66b which is bent at a right angle to first portion 66a. Flanges 66 provide a surface on which a person's thumb can be placed when pulling handle portion 18. Carrier tray 26 is preferably formed from cold rolled steel 1 mm thick and zinc plated but alternatively, can be made of other suitable metals.

A reinforcement plate 70 (FIG. 3) is mounted to carrier tray 26 for stiffening carrier plate 26. Plate 70 is mounted to carrier tray 26 with screws 80 through holes 76 of plate 70 and holes 68 in the first portion 66a of flanges 66. Plate 70 has three tabs 72 which engage slots 82 (FIG. 4) in tray portion 26a to further secure plate 70 to carrier tray 26. Plate 70 also includes two tabs 78 which engage the inner surfaces of the second portion 66b of flanges 66, thereby further strengthening tray portion 26a and flanges 66. Plate 70 is preferably fabricated from cold rolled steel and zinc plated.

Locking member 14 (FIGS. 2, 3 and 5) is formed from a single piece of resilient plastic and includes holes 52 within guide portions 24 allowing the locking member 14 to be mounted to the outer surfaces of side walls 42/44 by screws 50 and threaded holes 48 within side walls 42/44. Guide portions 24 extend along most of the length of side walls 42/44 and have ribs for added strength. Guide portions 24 are preferably 8.70 mm high by 5 mm thick but alternatively, can be larger or smaller depending upon the size of carrier tray 26. Guide portions 24 include tapered tips 54 for easy insertion through guide rails 28a/28b. Tapered tips 54 extend slightly past the rear portion 58 of carrier tray 26. Locking member 14 also includes two resilient cantilevered portions 56 which extend from guide portions 24 and behave as springs. Cantilevered portions 56 are capable of being bent or deflected inwardly toward each other. The locking protrusions 20 are located on the outer faces of cantilevered portions 56 and are triangular-shaped.

The protrusions 20 angle inwardly toward guide portions 24 such that disk drive assembly 12 can be pushed inwardly to engage recesses 21 but cannot be pulled outwardly once engaged in recesses 21 until handle 18 is pulled to move protrusions 20 inwardly toward each other to disengage protrusions 20 from recesses 21. Cantilevered portions 56 are narrower and thinner than guide portions 24 and are also spaced apart and parallel from side walls 42/44. This provides the cantilevered portions 56 with sufficient space to be easily bent inwardly or deflected toward each other for disengaging locking protrusions 20 from recesses 21. Although two locking protrusions 20 are preferred, alternatively, only one locking protrusion can be employed.

Handle portion 18 extends between the two cantilevered portions 56 along front wall 60. Handle portion 18 has a gripping region 18a and two transition portions 64 for spacing gripping region 18a away from front wall 60 to provide room for a person's fingers to grasp gripping region 18a. Transition portions 64 include a first leg 62 which lies along front wall 60 and a second leg 63 which extends away from front wall 60. Transition portions 64 are the same width and thickness as cantilevered portions 56 while gripping region 18a is wider to provide a larger grasping area. Transition portions 64 connect gripping region 18a to cantilevered portions 56 in a manner such that gripping region 18a is perpendicular to guide portions 24 and cantilevered portions 56. Legs 63 of transition portions 64 ride against posts surrounding screws 80 and limits the amount that handle portion 18 can be pulled. Due to the angle of legs 63, pulling on handle portion 18 in the direction away from carrier tray 26 deflects cantilevered portions 56 inwardly toward each other thereby moving protrusions 20 inwardly. Releasing handle portion 18 allows cantilevered portions 56 to spring back to their original position, thereby moving themselves and protrusions 20 away from each other. Locking member 14 is preferably molded from one piece of stiff resilient plastic but alternatively can be made of other suitable materials such as metal. Locking member 14 is preferably about 119 mm wide and 164.34 mm long but alternatively can have other suitable dimensions depending upon the size of disk drive 22 and carrier tray 26.

The design of carrier tray 26 and locking member 14 allow disk drive assembly 12 to be of a size that is not much larger than the disk drive 22 itself. As a result, computer enclosure 10 can have a smaller bay 11 for installing a given number disk drive assemblies 12 than is needed for current disk drive assemblies. This in turn allows the computer enclosure to be more compact.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. For example, carrier tray 26 is preferably stamped from sheet metal and zinc plated but alternatively can be made of plastic. In such a case, locking member 14 can be integrally molded within tray 26. In addition, locking member 14 can be mounted directly to disk drive 22 in which case, carrier tray 26 is omitted. Furthermore, guide portions can be formed on carrier tray 26 (or disk drive 22) so that locking member 14 only needs locking protrusions 20, cantilevered portions 56 and a handle portion 18. Finally, disk drive assemblies 12 have been shown to be positioned vertically within bay 11 but alternatively can be positioned horizontally.

What is claimed is:

1. A locking member formed of resilient material for locking a disk drive within a computer enclosure comprising:

first and second guide portions positioned along respective first and second sides of the disk drive for guiding the disk drive within the enclosure;

first and second locking protrusions extending from the first and second guide portions, respectively, capable of engaging with the enclosure for locking the disk drive therein; and a handle portion extending from and being positioned at a right angle to the locking protrusions for resiliently bending the locking protrusions inwardly towards each other to disengage the locking protrusions from the enclosure.

2. The locking member of claim 1 in which the first locking protrusion is positioned on a first cantilevered beam portion extending from the first guide portion.

3. The locking member of claim 2 in which the handle portion extends from and is at a right angle to the first cantilevered beam portion.

4. The locking member of claim 3 in which the second locking protrusion is positioned on a second cantilevered beam portion extending from the second guide portion.

5. The locking member of claim 4 in which the handle portion extends between and is positioned at a right angle to the first and second cantilevered beam portions.

6. The locking member of claim 4 in which the protrusions are triangular in shape.

7. The locking member of claim 1 in which the locking member is formed from one piece of plastic.

8. A locking member formed of resilient material for locking a disk drive within a computer enclosure comprising:
   first and second cantilevered beam portions positioned along respective first and second sides of the disk drive;
   first and second locking protrusions positioned on the first and second cantilevered beam portions, respectively, capable of engaging with the enclosure for locking the disk drive therein; and
   a handle portion extending from and being positioned at a right angle to the cantilevered beam portions for resiliently bending the cantilevered beam portions inwardly towards each other to disengage the locking protrusions from the enclosure.

9. The locking member of claim 8 further comprising:
   a first guide portion positioned along the first side of the disk drive, the first cantilevered beam portion extending from the first guide portion;
   a second guide portion positioned along the second side of the disk drive, the second cantilevered beam portion extending from the second guide portion, the first and second guide portions for guiding the disk drive within the enclosure.

10. The locking member of claim 9 in which the handle portion extends between the first and second cantilevered beam portions.

11. The locking member of claim 10 in which the locking member is formed from one piece of plastic.

12. A disk drive carrier for mounting a disk drive within a computer enclosure comprising:
   a tray for supporting the disk drive; and
   a locking member formed of resilient material mounted to the tray, the locking member having first and second guide portions positioned along respective first and second sides of the tray for guiding the disk drive into the enclosure, first and second locking protrusions extending from the first and second guide portions, respectively, capable of engaging with the enclosure for locking the disk drive therein, and a handle extending from and being positioned at a right angle to the locking protrusions for resiliently bending the locking protrusions inwardly towards each other to disengage the locking protrusions from the enclosure.

13. A method of releasably locking a disk drive within a computer enclosure with a locking member formed from resilient material comprising the steps of:
   positioning first and second cantilevered beam portions of the locking member along respective first and second sides of the disk drive;
   engaging the enclosure with first and second locking protrusions positioned on the first and second cantilevered beam portions, respectively, for locking the disk drive therein; and
   resiliently bending the cantilevered beam portions inwardly towards each other for disengaging the locking protrusions from the enclosure with a handle portion extending from and being positioned at a right angle to the cantilevered beam portions.

14. The method of claim 13 further comprising the steps of:
   positioning a first guide portion of the locking member along the first side of the disk drive, the first cantilevered beam portion extending from the first guide portion; and
   positioning a second guide portion along the second side of the disk drive, the second cantilevered beam portion extending from the second guide portion, the first and second guide portions for guiding the disk drive within the enclosure.

15. The method of claim 14 further comprising the step of extending the handle portion between the first and second cantilevered beam portions.

16. The method of claim 15 further comprising the step of forming the locking member from one piece of plastic.

17. The method of claim 16 further comprising the step of mounting the locking member to a tray supporting the disk drive.

18. A locking member formed of resilient material for locking a disk drive within a computer enclosure comprising:
   a first guide portion positioned along a first side of the disk drive for guiding the disk drive within the enclosure;
   a first locking protrusion positioned on a first cantilevered beam portion extending from the first guide portion, the first locking protrusion capable of engaging with the enclosure for locking the disk drive therein;
   a second guide portion positioned along a second side of the disk drive for guiding the disk drive within the enclosure;
   a second locking protrusion positioned on a second cantilevered beam portion extending from the second guide portion, the second locking protrusion capable of engaging with the enclosure for locking the disk drive therein; and
   a handle portion extending from the first and second locking protrusions for resiliently bending the first and second locking protrusions inwardly to disengage the first and second locking protrusions from the enclosure, the handle extending between and being positioned at a right angle to the first and second cantilevered beam portions.

19. A locking member formed of resilient material for locking a disk drive within a computer enclosure comprising:
   a first guide portion positioned along a first side of the disk drive for guiding the disk drive within the enclosure;
   a first locking protrusion positioned on a first cantilevered beam portion extending from the first guide portion, the first locking protrusion capable of engaging with the enclosure for locking the disk drive therein;
   a second guide portion positioned along a second side of the disk drive for guiding the disk drive within the enclosure;
   a second locking protrusion positioned on a second cantilevered beam portion extending from the second guide portion, the second locking protrusion capable of engaging with the enclosure for locking the disk drive therein;

a handle portion extending from and between the first and second cantilevered beam portions for resiliently bending the first and second cantilevered beam portions inwardly to disengage the first and second locking protrusions from the enclosure, the handle being positioned at a right angle to the first and second cantilevered beam portions.

20. The locking member of claim 19 in which the locking member is formed from one piece of plastic.

21. A method of releasably locking a disk drive within a computer enclosure with a locking member formed from resilient material comprising the steps of:

positioning a first guide portion of the locking member along a first side of the disk drive, a first cantilevered beam portion extending from the first guide portion;

positioning a second guide portion along a second side of the disk drive, a second cantilevered beam portion extending from the second guide portion, the first and second guide portions for guiding the disk drive within the enclosure;

engaging the enclosure with first and second locking protrusions positioned on the first and second cantilevered beam portions, respectively, for locking the disk drive therein; and resiliently bending the first and second cantilevered beam portions inwardly for disengaging the first and second locking protrusions from the enclosure with a handle portion extending from and between the first and second cantilevered beam portions, the handle portion extending at a right angle to the first and second cantilevered portions.

22. The method of claim 21 further comprising the step of forming the locking member from one piece of plastic.

23. The method of claim 22 further comprising the step of mounting the locking member to a tray supporting the disk drive.

* * * * *